United States Patent
Kashiwaya et al.

(10) Patent No.: US 6,888,292 B2
(45) Date of Patent: May 3, 2005

(54) MULTI-LAYERED TYPE PIEZOELECTRIC DEVICE AND PROCESS FOR PRODUCTION THEREOF

(75) Inventors: Toshikatsu Kashiwaya, Inazawa (JP); Mutsumi Kitagawa, Inuyama (JP)

(73) Assignee: NGK Insulators, Ltd., Nagoya (JP)

( * ) Notice: Subject to any disclaimer, the term of this patent is extended or adjusted under 35 U.S.C. 154(b) by 56 days.

(21) Appl. No.: 10/359,039

(22) Filed: Feb. 5, 2003

(65) Prior Publication Data

US 2004/0051422 A1 Mar. 18, 2004

(30) Foreign Application Priority Data

Feb. 8, 2002 (JP) .................................. 2002-033165
Nov. 12, 2002 (JP) .................................. 2002-328503

(51) Int. Cl.[7] .......................................... H01L 41/187
(52) U.S. Cl. .......................................... 310/358
(58) Field of Search .............................. 310/358, 328, 310/365

(56) References Cited

U.S. PATENT DOCUMENTS

| | | | |
|---|---|---|---|
| 6,565,997 B2 | 5/2003 | Kashiwaya | |
| 2002/0056827 A1 * | 5/2002 | Kashiwaya | ........... 252/62.9 PZ |
| 2002/0195172 A1 * | 12/2002 | Arai et al. | ................... 148/121 |
| 2003/0198745 A1 * | 10/2003 | Kashiwaya et al. | ......... 427/331 |

FOREIGN PATENT DOCUMENTS

| | | | | |
|---|---|---|---|---|
| EP | 1 321 986 A2 | 6/1993 | ......... H01L/41/187 |
| EP | 1 321 987 A2 | 6/2003 | ......... H01L/41/187 |
| JP | 42-20029 | 10/1942 | |
| JP | 44-17103 | 7/1969 | |
| JP | 45-8145 | 3/1970 | |
| JP | 50-3519 | 2/1975 | ......... H01L/41/16 |
| JP | 60-102779 | 6/1985 | ......... H01L/41/18 |
| JP | 02-035785 | 2/1990 | ......... H01L/41/09 |
| JP | 07-315926 A1 | 12/1995 | ......... C04B/35/49 |
| JP | 11-029357 | 2/1999 | |
| JP | 2001-181033 | 7/2001 | ......... C04B/35/49 |
| JP | 2002-217464 | 8/2002 | |
| JP | 2002-217465 | 8/2002 | ......... H01L/41/09 |

OTHER PUBLICATIONS

U.S. Appl. No. 10/847,791, filed May 18, 2004, Ebigase et al.

Hiromu Ouchi, Masamitsu Nishida, and Shigeru Hayakawa, *Piezoelectric Properties of $Pb(Mg_{1/3}Nb_{2/3})O_3$–$PbTiO_3$–$PbZrO_3$ Ceramics Modified with Certain Additives*, Journal of The American Ceramic Society, vol. 49, No. 11, Nov. 21, 1966, pp. 577–582.

* cited by examiner

Primary Examiner—Thomas M. Dougherty
(74) Attorney, Agent, or Firm—Burr & Brown

(57) ABSTRACT

A multi-layered piezoelectric device includes a plurality of piezoelectric portions and a plurality of electrodes electrically connected to the piezoelectric portions, that are formed in layers on a ceramic substrate. A first piezoelectric portion is made of a piezoelectric ceramic composition containing Ni in an amount of 0.08 to 0.31% by mass (in terms of NiO), and second and upper piezoelectric portions are made of a piezoelectric ceramic composition of higher Ni content than in the first piezoelectric portion. An electrode is provided at least between the first piezoelectric portion and the second piezoelectric portion.

7 Claims, 7 Drawing Sheets

FIG.4(a)
FIG.4(b)
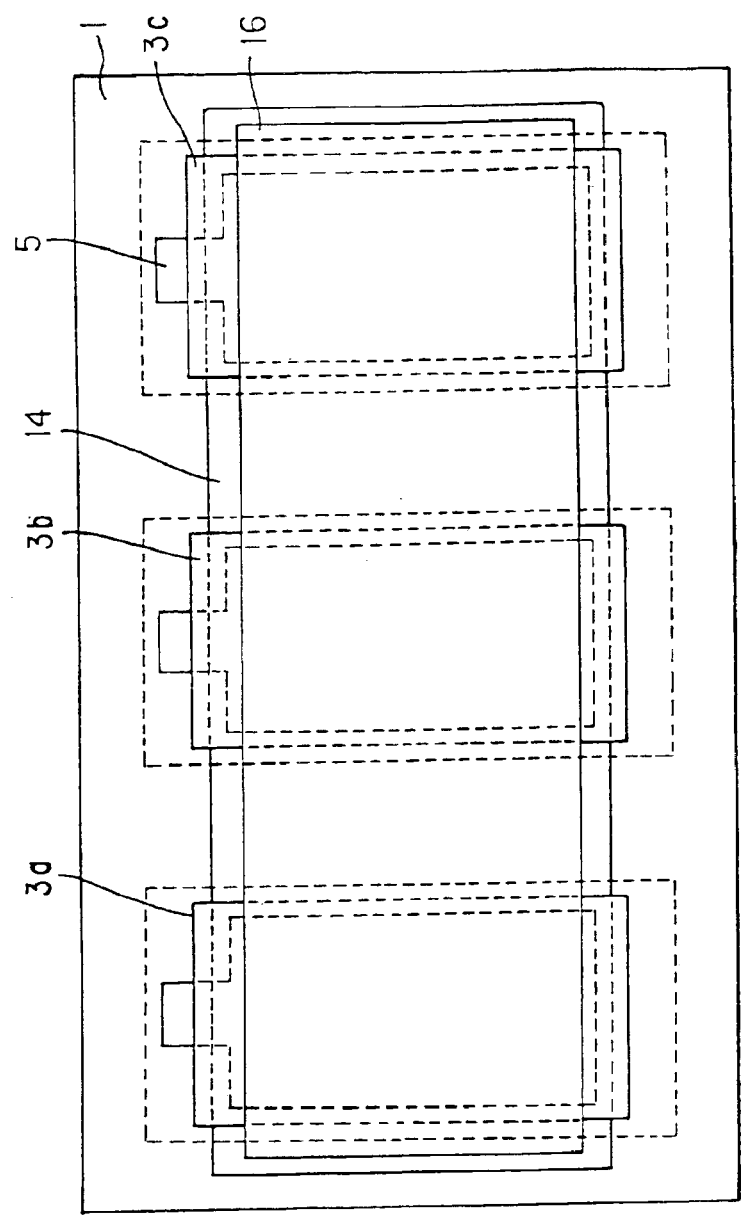
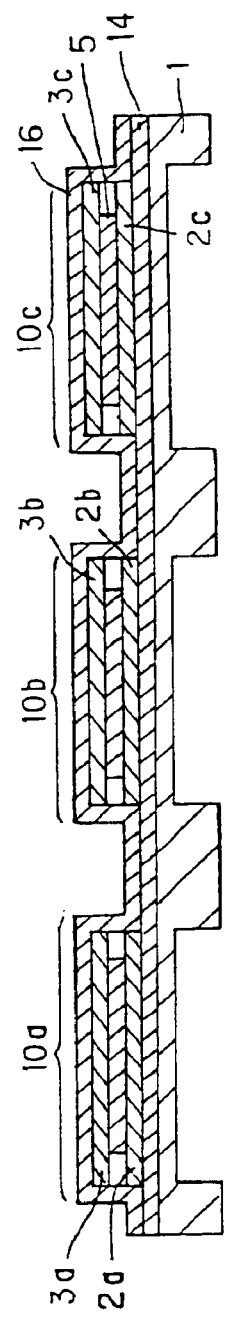

MULTI-LAYERED TYPE PIEZOELECTRIC DEVICE AND PROCESS FOR PRODUCTION THEREOF

BACKGROUND OF THE INVENTION AND RELATED ART

The present invention relates to a multi-layered piezoelectric device. More particularly, the present invention relates to a multi-layered piezoelectric device which has a very high piezoelectric characteristic, which is superior in transmitting oscillation between the ceramic substrate and the piezoelectric portion, and which provides a small and highly integrated actuator or sensor, as well as to a process for the production thereof.

In recent years, piezoelectric devices have been used in ink jet printer heads, speakers, microphones, etc. Known piezoelectric devices generally have a piezoelectric portion made of a piezoelectric ceramic composition formed on a ceramic substrate and electrodes electrically connected to the piezoelectric portion. Recently, multi-layered piezoelectric devices have come into use, including piezoelectric portions and electrodes alternately formed on a substrate in a large number of layers, which produce a high output at a low voltage.

Meanwhile, various investigations have been made with respect to the piezoelectric ceramic composition constituting the piezoelectric portion. For example, $Pb(Mg_{1/3}Nb_{2/3})O_3$—$PbTiO_3$—$PbZrO_3$ ternary solid solution system compositions, or piezoelectric ceramic compositions wherein in the above compositions, part of Pb is substituted with Sr, La or the like, are disclosed in JP-B-44-17103 and JP-B-45-8145. It is expected that such a composition can provide a piezoelectric device in which the piezoelectric portion, as the most important element determining the piezoelectric characteristic of piezoelectric device, has per se an excellent piezoelectric characteristic (for example, in piezoelectric d constant).

Conventional piezoelectric devices were produced by forming a piezoelectric material layer made of such a piezoelectric ceramic composition on a ceramic substrate and then heat-treating the resulting laminate. As a result, the piezoelectric portion has a low density due to the restraint of the substrate, and there have been problems in that the flexural displacement is low, or when a voltage has been applied, dielectric breakdown occurs at a low density moiety. This problem is particularly prevalent in multi-layered piezoelectric devices, and an improvement therefor has been strongly needed.

Under such a situation, JP-A-11-29357 discloses a conventional piezoelectric device obtained by heat-treating a piezoelectric material made of the above-mentioned piezoelectric ceramic composition to form a piezoelectric portion, and attaching the piezoelectric portion to a ceramic substrate to attain densification of piezoelectric portion.

In this piezoelectric device, however, an inorganic or organic adhesive must be used in attaching the piezoelectric portion to the substrate. As a result, there have been cases where the adhesive hinders the transmission of oscillation between the substrate and the piezoelectric portion, or the adhesive component deteriorates the characteristics of the piezoelectric portion and the substrate. Further, in conventional multi-layered piezoelectric devices, no consideration has been made with respect to using piezoelectric ceramic compositions of different formulations in individual piezoelectric portion layers, and sufficient piezoelectric characteristics have not been obtained.

SUMMARY OF THE INVENTION

The present invention has been made in view of the above problems and aims to provide a piezoelectric device which has a very high piezoelectric characteristic, which is superior in transmitting oscillation between the ceramic substrate and the piezoelectric portion, and which is suitably used in actuator, sensor, etc., and a process for production thereof.

In order to achieve the above aim, the present inventor made an intensive study, and found first that when a Ni-containing piezoelectric ceramic composition is used as a piezoelectric material to form the piezoelectric portion, the piezoelectric portion is densified even when heat-treatment of the piezoelectric material is conducted after its coating on a substrate. However, when individual piezoelectric portions were formed using the same piezoelectric material of that particular piezoelectric ceramic composition containing Ni at a relatively high concentration, a heterogeneous phase composed mainly of $ZrO_2$ generated in each piezoelectric portion, which incurred a new problem of hindering the improvement in the piezoelectric characteristics. Hence, the present inventor formed, on a substrate, a first piezoelectric material layer having a low Ni content, formed on an electrode thereon as an obstacle to Ni migration to cover the first piezoelectric material layer, then formed a second piezoelectric material layer having a high Ni content, and lastly, heat-treated the laminate to produce a multi-layered piezoelectric device. In this device, substantially no heterogeneous phase was generated in each piezoelectric portion, each piezoelectric phase was well densified, and the device had a very high piezoelectric characteristic as a whole. The present invention has been completed based on the above findings.

The present invention provides a multi-layered piezoelectric device having, on a ceramic-made substrate, a plurality of piezoelectric portions and a plurality of electrodes electrically connected to the piezoelectric portions, in layers, characterized in that a first piezoelectric portion which is a first layer from the substrate, is made of a piezoelectric ceramic composition containing Ni in an amount of 0.08 to 0.31% by mass (in terms of NiO), second and upper piezoelectric portions are made of a piezoelectric ceramic composition of higher Ni content than in the first piezoelectric portion, and an electrode is provided at least between the first piezoelectric portion and the second piezoelectric portion. In the present specification, all expressions such as "first," "second" and the like indicate an order of lamination starting from the substrate; for example, a first piezoelectric portion means a piezoelectric portion which is a first layer from the substrate.

In the present invention, it is preferred that the first piezoelectric portion is made of a piezoelectric ceramic composition containing, as a major component, a $Pb(Mg, Ni)_{1/3}Nb_{2/3}O_3$—$PbZrO_3$—$PbTiO_3$ ternary solid solution system composition represented by the following general formula (1) and the second and upper piezoelectric portions are made of a piezoelectric composition containing, as a major component, a $PbMg_{1/3}Nb_{2/3}O_3$—$PbZrO_3$—$PbTiO_3$ ternary solid solution system composition represented by the following general formula (2) and further containing NiO:

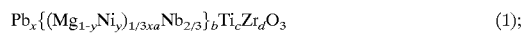

wherein x is $0.95 \leq x \leq 1.05$; y is $0.05 \leq y \leq 0.50$; a is $0.90 \leq a \leq 1.10$; b, c and d are decimal fractions falling, in coordinates formed by three coordinate axes of b, c and d, in a range of (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and b+c+d=1.000; and

wherein x is 0.95≦x≦1.05; y is 0.95≦y≦1.05; a, b and c are decimal fractions falling, in coordinates formed by three coordinate axes of a, b and c, in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and a+b+c=1.00.

In the present invention, it is also preferred that the Ni content ratio (first/second) of the first piezoelectric portion to the second piezoelectric portion is 0.1 to 0.2 (as a mass ratio in terms of NiO). It is also preferred that third and upper piezoelectric portions are made of a piezoelectric ceramic composition having an Ni content that is the same or larger than that in the second piezoelectric portion.

In the present invention, it is also preferred that the first piezoelectric portion is solidly attached to the substrate directly or via an electrode.

present invention also provides a process for producing a multi-layered piezoelectric device, characterized by comprising the steps of forming, on a ceramic-made substrate or on an electrode formed on the substrate, a first piezoelectric material layer containing Ni in an amount of 0.08 to 0.31% by mass (in terms of NiO), forming an electrode on the first piezoelectric material layer and then forming, on the electrode, a second piezoelectric material layer of Ni content larger than in the first piezoelectric material layer, and forming at least the required number of piezoelectric material layers and then heat-treating the resulting laminate.

In the process of the present invention, a multi-layered piezoelectric device having three or more piezoelectric layers can be produced by allowing the process to include at least one step of forming an electrode on the second piezoelectric material layer and then forming thereon a third piezoelectric material layer of Ni content same as or larger than in the second piezoelectric material layer. Also in the present invention, it is preferred that the heat treatment is conducted in the presence of an atmosphere-controlling material of substantially the same Ni content as in the piezoelectric material layer formed last.

The multi-layered piezoelectric device according to the present invention can be used as a dense and small dielectric device or pyroelectric device in capacitors and sensors.

BRIEF DESCRIPTION OF THE DRAWINGS

FIG. 4($a$) is a top view schematically showing another embodiment of the present invention, and FIG. 4($b$) is a sectional view thereof.

DETAILED DESCRIPTION OF THE INVENTION

Modes for carrying out the present invention are specifically described below referring to the accompanying drawings. The following description is made mainly on piezoelectric devices having two piezoelectric layers; however, the same description applies also to piezoelectric devices having three or more piezoelectric layers, as long as they include the features of the present invention.

Figure 1:
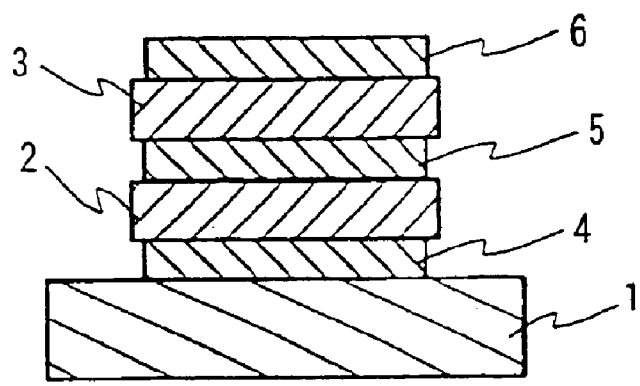
FIG. 1 is a sectional view schematically showing an embodiment of the present invention.

The substrate 1 of the present invention, shown in FIG. 1, etc. may be made of a ceramic and has no particular restriction as to other respects. From the standpoints of heat resistance, chemical stability and insulation, it is preferred that the ceramic contains at least one material selected from the group consisting of stabilized zirconium oxide, aluminum oxide, magnesium oxide, mullite, aluminum nitride, silicon nitride and glass. From the standpoint of high mechanical strength and superior tenacity, it is more preferable that the ceramic contains stabilized zirconium oxide.

In the present invention, the thickness of the substrate 1 is preferably 3 μm to 1 mm, more preferably 5 to 500 μm, particularly preferably 7 to 200 μm.

When the thickness of the substrate 1 is less than 3 μm, the mechanical strength of piezoelectric device may be low. When the thickness is more than 1 mm, the rigidity of substrate against the shrinkage stress of piezoelectric portions 2 and 3 is large when a voltage has been applied to the piezoelectric device, and the flexural displacement of the piezoelectric device may be small.

Figure 2:
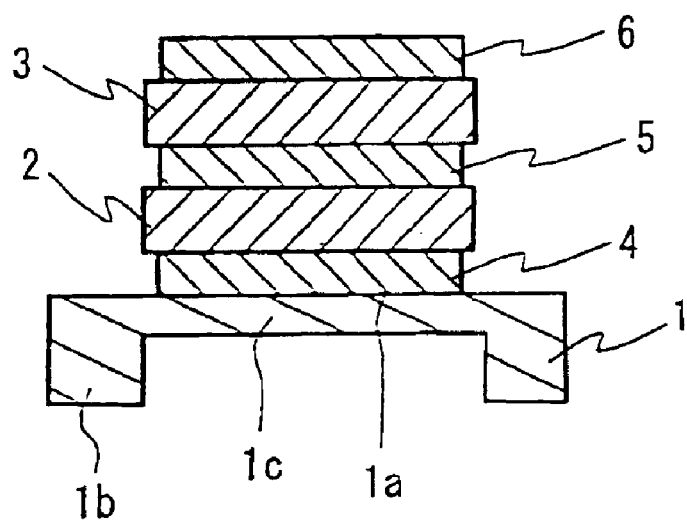
FIG. 2 is a sectional view schematically showing another embodiment of the present invention.

As shown in FIG. 2, the substrate 1 may have a thin part 1$c$ which is formed so as to approximately correspond to piezoelectric portions (FIG. 2 shows the case in which an electrode is solidly attached) or to a surface area 1$a$ of the substrate 1 to which an electrode 4 is solidly attached and which has the above-mentioned thickness, and a thick part 1$b$ which is formed to approximately correspond to the surface area of the substrate other than the surface area 1$a$, and which has a thickness that is larger than that of the thin part 1$c$. Thereby, the flexural displacement and mechanical strength of piezoelectric device can be made large.

Figure 3:
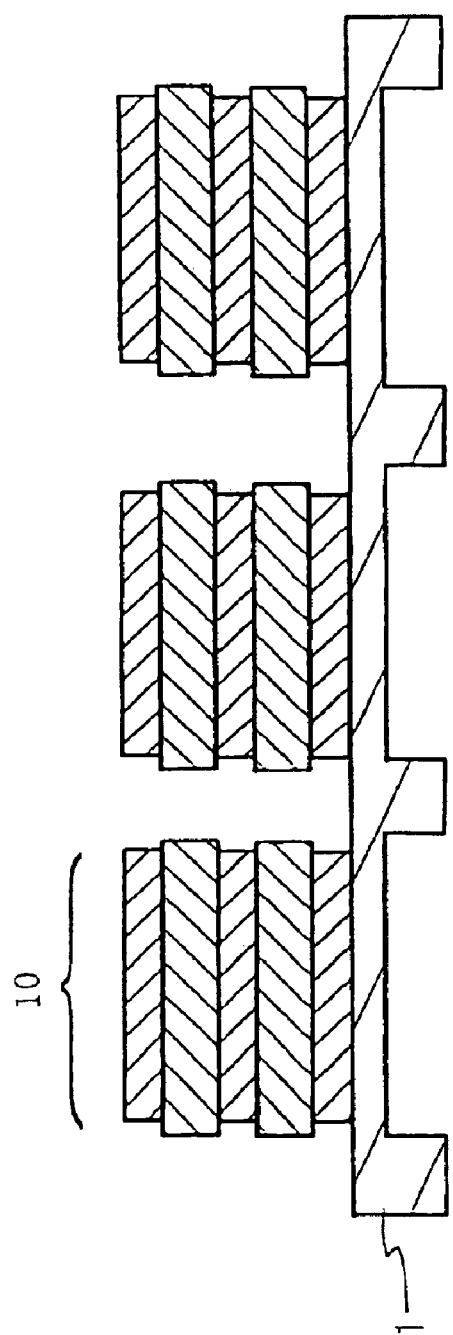
FIG. 3 is a sectional view schematically showing another embodiment of the present invention.

It is also possible to form, as shown in FIG. 3, a plurality of multi-layered piezoelectric device units 10 on a common substrate 1.

In the present invention, there is no particular restriction as to the surface shape of the substrate 1. The surface shape can be, for example, a rectangular shape, a square shape, a triangular shape, an oval shape, a truly circular shape, a rounded square shape, a rounded rectangular shape, a capsule shape and a composite shape which is a combination of the above shapes.

Figure 6:
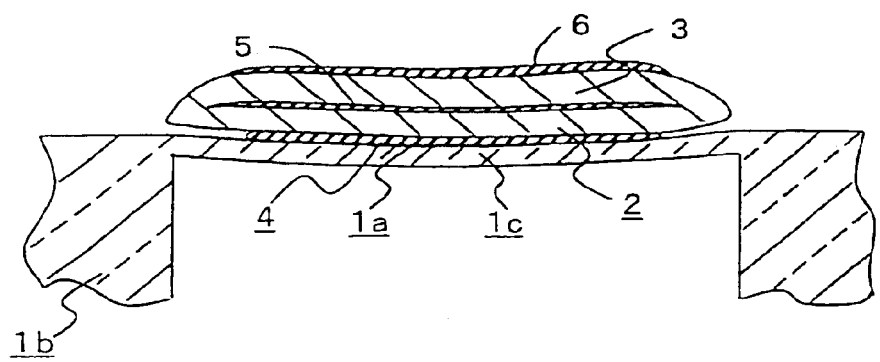
FIG. 6 is a sectional view showing other more specific example of the embodiment shown in FIG. 2.
Figure 7:
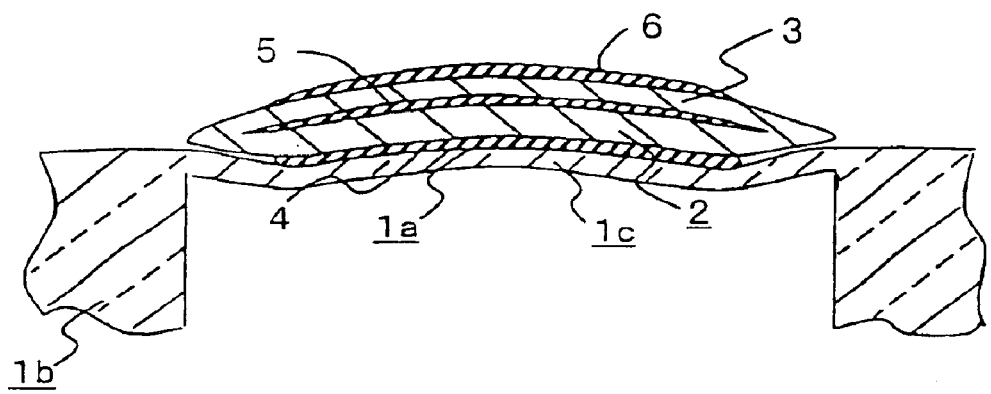
FIG. 7 is a sectional view showing still other more specific example of the embodiment shown in FIG. 2.

The thin part 1$c$ is preferred to have a shape such as shown in FIG. 6, which is bent at the center toward the side opposite to the side having piezoelectric portions 2 and 3 formed thereon, because in such a shape, the linearity of flexural displacement to electric field is high; or a shape such as shown in FIG. 7, whose section in thickness direction has a W shape having three infection points. Incidentally, the bent shape shown in FIG. 6 can be formed by utilizing shrinkage occurring in each heat treatment step of piezoelectric portions 2 and 3, and the W shape shown in FIG. 7 can be formed by controlling the start timings and/or amounts of firing shrinkage of piezoelectric portions 2 and 3, and the shape of thin part 1$c$.

Next, as to the piezoelectric portions 2 and 3 of the present invention, the first piezoelectric portion 2 nearest to the substrate 1 is made of a piezoelectric ceramic composition containing Ni in an amount of 0.08 to 0.31% by mass (in terms of NiO), and the second and upper piezoelectric portions 3 are made of a piezoelectric ceramic composition having a Ni content that is larger than in the first piezoelectric portion 2.

Thereby, in the first piezoelectric portion 2, there is no formation of a heterogeneous phase containing $ZrO_2$ as a major component, and the proportion of perovskite phase contributing to flexural displacement is large. As a result, this characteristic of composition per se can give a piezoelectric device having improved piezoelectric characteristics. Moreover, in the second and upper piezoelectric portions 3, the restraint of substrate 1 associated with sintering shrinkage is small and the effect of high Ni content is striking. Therefore, the second and upper piezoelectric portions 3 are highly densified by the heat treatment in the production process, which densities even the adjacent first piezoelectric portion 2. This, coupled with the characteristic of ceramic composition per se, can give a piezoelectric device having high piezoelectric characteristics.

In the present invention, the first piezoelectric portion 2 is preferably made of a ceramic composition containing Ni in an amount of 0.15 to 0.28% by mass (in terms of NiO) and is more preferably made of a ceramic composition containing Ni in an amount of 0.18 to 0.25% by mass (in terms of NiO), in order to better densify the piezoelectric portion 2 and better prevent the formation of heterogeneous phase.

In the present invention, the Ni content ratio (first/second) of the first piezoelectric portion 2 and the second piezoelectric portion 3 is preferably 0.07 to 0.25 (mass ratio in terms of NiO), more preferably 0.10 to 0.20 (mass ratio in terms of NiO), particularly preferably 0.12 to 0.18 (mass ratio in terms of NiO).

When the Ni content ratio (first/second) is less than 0.07 (mass ratio in terms of NiO), the heterogeneous phase in the second piezoelectric portion 3 tends to be large and accordingly the whole piezoelectric characteristic tends to be small. Meanwhile, when the Ni content ratio (first/second) is more than 0.25 (mass ratio in terms of NiO), the densification in the second piezoelectric portion 3 tends to be small, and accordingly the first piezoelectric portion 2 is also not densified, and the overall piezoelectric characteristic tends to be small.

Incidentally, also when three or more layers of piezoelectric portions are formed, the second piezoelectric portion 2 preferably has the above Ni content ratio relative to the first piezoelectric portion. In order to further promote the densification of individual piezoelectric portions, it is preferred that the third and upper piezoelectric portions have a Ni content that is the same as or larger than that in the second piezoelectric portion.

In the present invention, as the piezoelectric ceramic composition constituting each piezoelectric portion, there can be mentioned, for example, a $PbTiO_3$—$PbZrO_3$ binary solid solution system composition, a NiO-added $Pb(Mg_{1/3}Nb_{2/3})O_3$—$PbTiO_3$—$PbZrO_3$ ternary solid solution system composition, and a $Pb(Mg,Ni)_{1/3}Nb_{2/3}O_3$—$PbZrO_3$—$PbTiO_3$ ternary solid solution system composition obtained by substituting part of Mg with Ni in a ternary solid solution system composition. Of these, preferred are, for excellent piezoelectric characteristic, a NiO-added $Pb(Mg_{1/3}Nb_{2/3})O_3$—$PbTiO_3$—$PbZrO_3$ ternary solid solution system composition (hereinafter, this composition is referred to as "ternary and addition system composition" for convenience of description), and a $Pb(Mg,Ni)_{1/3}Nb_{2/3}O_3$—$PbZrO_3$—$PbTiO_3$ ternary solid solution system composition (hereinafter, this composition is referred to as "ternary and substitution system composition" for convenience of description).

In the present invention, the piezoelectric portions 2 and 3 may be constituted with any one of these piezoelectric ceramic compositions, or with a combination of two or more of these piezoelectric ceramic compositions, as long as the Ni content requirement for each piezoelectric layer is satisfied. From the standpoint of improving the piezoelectric characteristics, however, it is preferred that each of the piezoelectric portions 2 and 3 is constituted with a ternary and addition system composition, or the first piezoelectric portion 2 is constituted with a ternary and substitution system composition and the second and upper piezoelectric portions 3 are constituted with a ternary and addition system composition. The latter constitution is preferred.

In the present invention, the ternary and addition system composition preferably contains a composition represented by the following general formula (2) as a major component and further containing NiO, for the high piezoelectric characteristic:

$$Pb_x(Mg_{y/3}Nb_{2/3})_aTi_bZr_cO_3 \qquad (2);$$

wherein x is $0.95 \leq x \leq 1.05$; y is $0.95 \leq y \leq 1.05$; a, b and c are decimal fractions falling, in coordinates formed by three coordinate axes of a, b and c, in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and a+b+c=1.00.

Similarly, the ternary and substitution system composition is preferably represented by the following general formula (1), for the high piezoelectric characteristic:

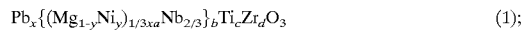

$$Pb_x\{(Mg_{1-y}Ni_y)_{1/3xa}Nb_{2/3}\}_bTi_cZr_dO_3 \qquad (1);$$

wherein x is $0.95 \leq x \leq 1.05$; y is $0.05 \leq y \leq 0.50$; a is $0.90 \leq a \leq 1.10$; b, c and d are decimal fractions falling, in coordinates formed by three coordinate axes of b, c and d, in a range of (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and b+c+d=1.000.

Needless to say, in the formula (1), the preferred range of y varies dependently upon the preferred Ni content in each piezoelectric portion. For example, y is $0.05 \leq y \leq 0.20$ in the first piezoelectric portion and is $0.10 \leq y \leq 0.50$ in the second and upper piezoelectric portions.

In the present invention, the piezoelectric ceramic compositions constituting the piezoelectric portions 2 and 3 have the above-mentioned Ni contents. Therefore, the proportion of heterogeneous phase composed mainly of $ZrO_2$, in total piezoelectric ceramic compositions of total piezoelectric portions is 2% by volume or less and, particularly when the Ni content is made low as a whole, the proportion of heterogeneous phase in total piezoelectric ceramic compositions of total piezoelectric portions is 1% by volume or less. Consequently, in the present invention, the proportion of perovskite phase (which contributes to flexural displacement) in total piezoelectric ceramic compositions of total piezoelectric portions can be controlled at 90% by volume or more and, when the Ni content is made low as a whole, at 95% by volume or more.

In the present invention, each piezoelectric ceramic composition has an average grain size preferably in a range of 1 to 10 μm, and more preferably, in a range of 2 to 5 μm. When the average grain size is less than 1 μm, domains do not sufficiently develop in each piezoelectric portion, and accordingly, the flexural displacement tends to be small. Meanwhile, when the average grain size is more than 10 μm, domains in piezoelectric portion are large, but hardly move and accordingly, the flexural displacement tends to be small, as well.

In the present invention, the Pb in the piezoelectric ceramic composition is preferably substituted with at least one kind of material selected from the group consisting of Sr, Ca, Ba and La for improved piezoelectric characteristics. Substitution of Pb in the piezoelectric ceramic composition at a high ratio invites a reduction in flexural displacement and a large fluctuation of flexural displacement by temperature change. Hence, the substitution is preferably conducted in an appropriate ratio range for each substituting element.

Specifically, the Pb in piezoelectric ceramic composition is preferably substituted by 2 to 10 mole %, more preferably by 4 to 8 mole %, when the Pb in piezoelectric ceramic composition is substituted with at least one kind of material selected from the group consisting of Sr, Ca and Ba. When the Pb in piezoelectric ceramic composition is substituted with La, the Pb in piezoelectric ceramic composition is preferably substituted by 0.2 to 1.0 mole %, more preferably by 0.4 to 0.9 mole %.

In order for each piezoelectric portion 2 or 3 to secure the desired flexural displacement and the desired mechanical strength, the piezoelectric portion preferably has a porosity of 10% or less by volume, more preferably, 5% or less by volume.

The thickness of each piezoelectric portion 2 or 3 is preferably 1 to 300 μm, more preferably 3 to 100 μm, particularly preferably 5 to 30 μm. When the thickness of each piezoelectric portion is less than 1 μm, the piezoelectric portion tends to be insufficiently densified even though it is made of the particular piezoelectric ceramic composition mentioned above. Meanwhile, when the thickness of each piezoelectric portion is more than 300 μm, a ceramic substrate having a higher thickness is required to prevent substrate breakage, making it difficult to produce a small piezoelectric device.

The ratio (substrate/total piezoelectric portions) of the thickness of substrate 1 to the total thickness of piezoelectric portions 2 and 3 is preferably 0.1 to 30, more preferably 0.3 to 10, particularly preferably 0.5 to 5 from the standpoint of securing mechanical strength for the piezoelectric device and improving the flexural displacement of piezoelectric device. In the present invention, there is no particular restriction as to the shape of piezoelectric portions 2 and 3. However, when they are formed by, for example, screen printing, the thickness of the piezoelectric portions becomes gradually smaller from the center to the ends as shown in FIGS. 5 to 10, due to the fluidity of the paste (containing the piezoelectric material) used in the screen printing.

In the present invention, it is preferred that the first piezoelectric portion 2 is solidly attached to the substrate 1 directly or via an electrode 4, as described later. Thereby, it is possible to avoid a reduction in oscillation transmission between substrate 1 and the first piezoelectric portion 2 due to the presence of an adhesive or the like, and a deterioration in the characteristics of the first piezoelectric portion 2 or substrate 1 due to the influence of an adhesive component or the like. Incidentally, the expression "being solidly attached" means that the first piezoelectric portion 2 and the substrate 1 or the electrode 4 become a tightly integrated structure due to their solid phase reaction, without using any organic or inorganic adhesive.

Next, in the present invention, the electrodes 4 to 6 are electrically connected to the piezoelectric portions 2 and 3 and are provided at least between the first piezoelectric portion 2 and the second piezoelectric portion 3.

Due to such a constitution, the electrode 4 can also function as an obstacle to Ni migration, and it is possible to prevent the formation of heterogeneous phase resulting from the migration of Ni from the second and upper piezoelectric portions to the first piezoelectric portion of low Ni content.

Hence, in the present invention, it is preferred to form electrodes to correspond to those parts of piezoelectric portions 2 and 3 substantially contributing to flexural displacement. Specifically, electrodes are preferably formed to correspond to a part of piezoelectric portion layer 2 or 3 which is 80% or more of the layer surface, including the center of the layer.

In the present invention, there is no particular restriction as to the positions of other electrodes. However, a structure in which each electrode is formed between two piezoelectric portions, and moreover, having piezoelectric portions and electrodes alternately laminated, is preferred because with such a structure, the same electric field can be applied to all piezoelectric portions, thereby all of the piezoelectric portions can be operated more efficiently.

Also, when the substrate 1 is commonly used for a plurality of multi-layered piezoelectric device units 10a to 10c as shown in FIGS. 4(a) and 4(b), the lowermost electrode 14 and the uppermost electrode 16 in the multi-layered piezoelectric device units 10a to 10c may be an integrated electrode 14 which is jointly used by the multi-layered piezoelectric device units 10 and which is formed in areas corresponding to the piezoelectric portions 2a to 2c and 3a to 3c. In such an electrode, the shape need not correspond to the individual piezoelectric portions 2a to 2c and 3a to 3c, and positioning during electrode formation is easy.

The material for electrodes 4 to 6 can include at least one kind of material selected from the group consisting of platinum, palladium, rhodium, silver and alloys thereof. Of these, platinum or an alloy composed mainly of platinum is preferred for the high heat resistance shown in heat treatment of piezoelectric portion 1.

Figure 5:
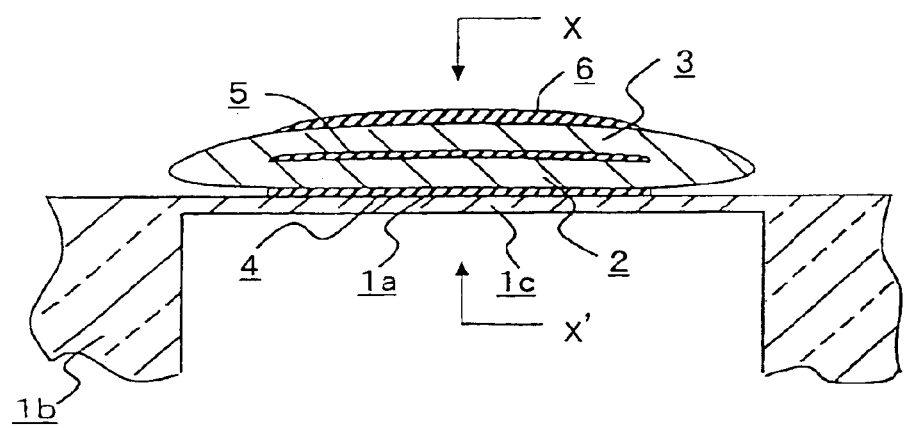
FIG. 5 is a sectional view showing a more specific example of the embodiment shown in FIG. 2.
Figure 11A:
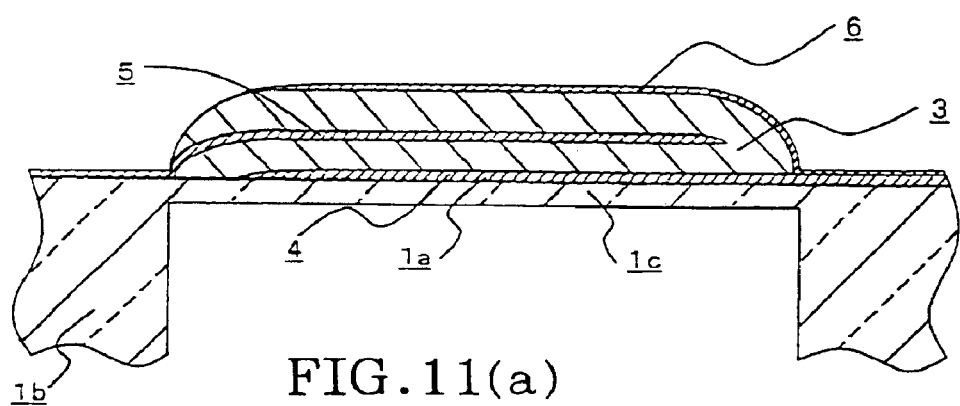
FIG. 11($a$) is a sectional view taken at X–X' of FIG. 5, and FIG. 11($b$) is a top view of FIG. 5.
Figure 11B:
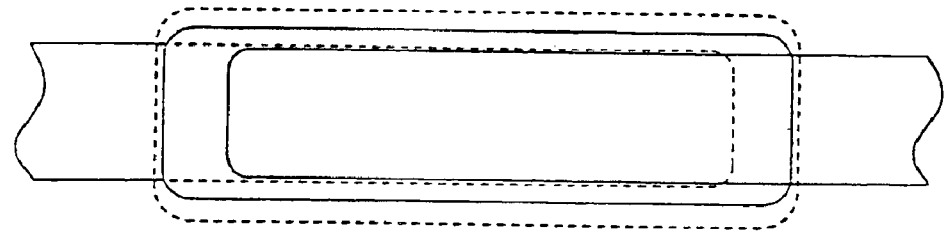

In the present invention, there is no particular restriction as to the dimensions of electrodes 4 to 6. For example, it is possible that, as shown in FIG. 5 and FIGS. 11(a) and 11(b), the electrodes 4 to 6 have the same dimension and are formed in the same range in the thickness direction.

Figure 8:
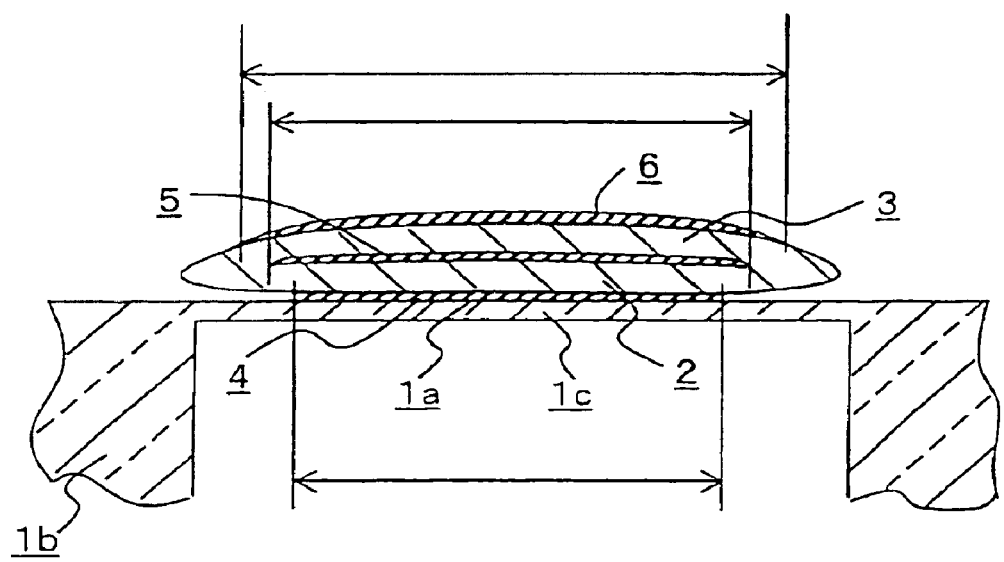
FIG. 8 is a sectional view showing still other more specific example of the embodiment shown in FIG. 2.

As shown in FIG. 8, it is also preferred that the electrodes 4 to 6 are formed so that the lowermost layer electrode 4 has the smallest range and each upper layer electrode has a larger range including the range of the lower layer electrode.

By allowing the ranges of the electrodes 4 to 6 to have such an inclination, the piezoelectric portion of the upper layer can be strained more than the piezoelectric portion of the lower layer. As a result, a higher bending efficiency is obtainable and more efficient flexural displacement can be exhibited.

Figure 9:
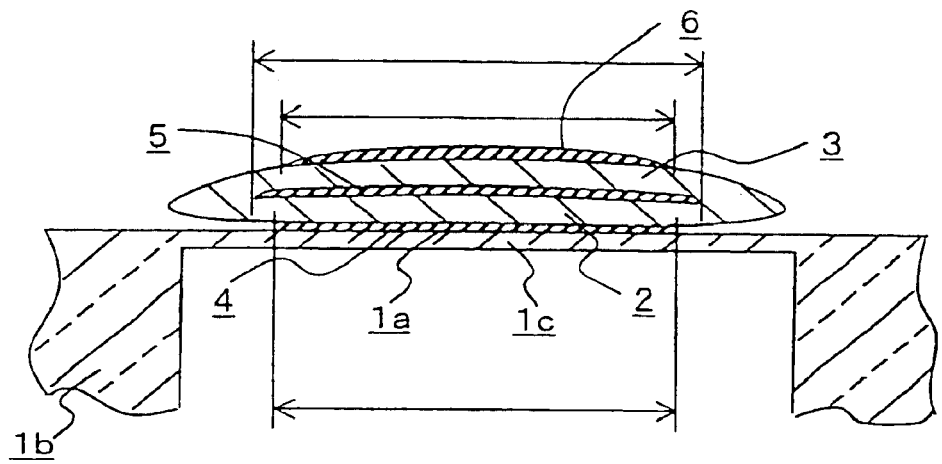
FIG. 9 is a sectional view showing still other more specific example of the embodiment shown in FIG. 2.
Figure 10:
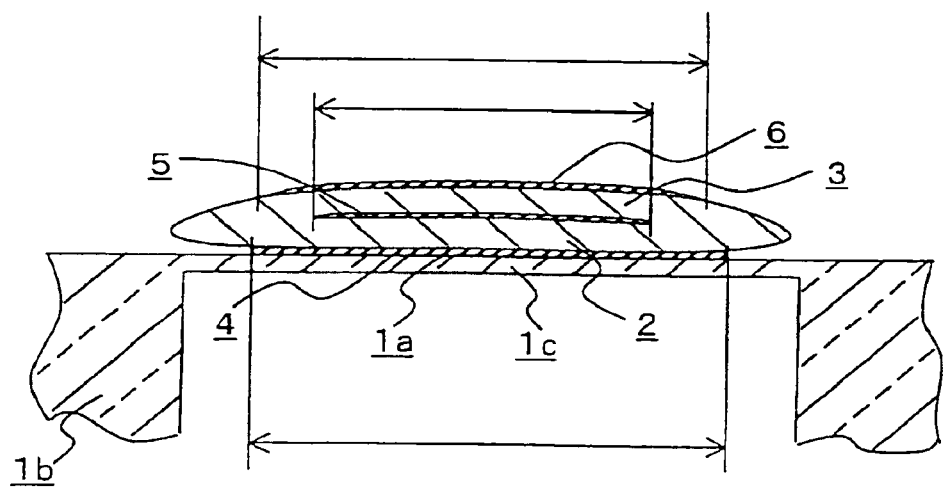
FIG. 10 is a sectional view showing still other more specific example of the embodiment shown in FIG. 2.

When, in the present invention, it is desired to achieve a larger flexural displacement by enhancing the driving voltage of multi-layered piezoelectric device, it is preferred that, as shown in FIG. 9, the intermediate electrode 5 is formed in a wider range (including ranges corresponding to the lower and upper layer electrodes 4 and 6) than the lower and upper layer electrodes 4 and 6, or that, as shown in FIG. 10, the intermediate electrode 5 is formed in a narrower range (included in ranges corresponding to the lower and upper layer electrodes 4 and 6) than the lower and upper layer electrodes 4 and 6.

By allowing the ranges of the electrodes to have such an inclination, substantially no electric field is applied in the vicinity of each end of piezoelectric portions 2 and 3, where the layer thicknesses tend to be smaller, and the piezoelectric portions can be free from dielectric breakdown.

In the piezoelectric device having the above-mentioned inclination in the ranges of electrodes, the degree of the inclination is preferably optimized in view of the distribution of electric field. For example, the ratio of the areas of two electrode layers 4 and 5 (or 5 and 6) adjacent to each other via piezoelectric portion 2 (or 3) is preferably 0.5 to 2, more preferably 0.67 to 1.5, further preferably 0.83 to 1.2.

In the present invention, the thickness of each of the electrodes 4 to 6 is preferably 15 $\mu$m or less, more preferably 5 $\mu$m or less. When each thickness of electrodes 4 to 6 is more than 15 $\mu$m, the electrodes 4 to 6 function as a buffer layer, which may make flexural displacement small.

An example of such a multi-layered piezoelectric device includes, for example, one in which the thin part 1c has a length of 1.1 mm, a width of 0.16 mm and a thickness of 6 $\mu$m, the lower electrode has a width of 0.12 mm and a thickness of 3 $\mu$m, the lower piezoelectric portion 2 has a length of 1.1 mm, a width of 0.16 mm and a thickness of 9 $\mu$m, the intermediate electrode 5 has a width of 0.13 mm and a thickness of 2 $\mu$m, the upper layer piezoelectric portion 3 has a length of 1.1 mm, a width of 0.16 mm and a thickness of 8 $\mu$m, and the upper electrode has a width of 0.12 mm and a thickness of 0.3 $\mu$m.

Next, the process for producing the multi-layered piezoelectric device of the present invention is described.

In the present invention, first, a first piezoelectric material layer containing Ni in an amount of 0.08 to 0.31% by mass (in terms of NiO) is formed on a ceramic-made substrate or on an electrode formed on the substrate. The substrate used in the present invention can be produced by subjecting a material corresponding to the ceramic material mentioned above (with respect to the substrate of the piezoelectric device of the present invention), to ordinary pressing, ordinary extrusion or the like to produce a molded material having the desired shape, and then firing the molded material under ordinary conditions. The previously mentioned shape, thickness, etc. of the substrate are again not explained here.

Examples of methods for forming an electrode on the substrate include ion beam, sputtering, vacuum deposition, PVD, ion plating, CVD, plating, screen printing, spraying and dipping. Of these, sputtering and screen printing are preferred for the bondability of the electrode with the substrate and the piezoelectric portion.

The formed electrode can be integrated with the substrate and/or a piezoelectric portion by heat treatment at about 1,000 to 1,400° C. In this case, the heat treatment may be conducted when the electrode has been formed and before the formation of a piezoelectric material layer, or may be conducted after the desired laminate has been produced.

The piezoelectric material used in the present invention can be produced by mixing various raw materials to correspond to the desired piezoelectric ceramic composition, calcining the mixed raw material and then grinding the calcined material, or by calcining the mixed raw material, adding NiO to the calcined material, calcining the resulting mixture, and grinding the resulting material. A method for producing a piezoelectric material containing a ternary and addition system composition, which is a representative piezoelectric material, is specifically explained below.

First, simple substances of elements (Pb, Ba, Ca, Sr, La, Mg, Nb, Zr and Ti), oxides of these elements (e.g. PbO, $Pb_3O_4$, $La_2O_3$, MgO, $Nb_2O_5$, $TiO_2$ and $ZrO_2$), carbonates of these elements (e.g. $BaCO_3$, $SrCO_3$, $MgCO_3$ and $CaCO_3$), compounds containing a plurality of such elements (e.g. $MgNb_2O$), etc. are mixed so that the contents of these elements (Pb, Ba, Ca, Sr, La, Mg, Nb, Zr and Ti) give the formulation of the desired piezoelectric ceramic composition, to produce a raw material which becomes the major component of the piezoelectric ceramic composition.

Next, this mixed raw material is calcined at 750 to 1,300° C. to obtain a piezoelectric ceramic composition, which is calcined. A desired amount of NiO is added thereto, and the mixture is calcined again at 750 to 1,300° C. The resulting piezoelectric ceramic composition, when subjected to X-ray diffractometry, preferably gives a ratio of the highest intensity of pyrochroite phase and the highest intensity of perovskite phase, of 5% or less, and more preferably, gives a ratio of 2% or less.

Then, the piezoelectric ceramic composition obtained is ground using an ordinary grinder such as ball mill, attritor, bead mill or the like to obtain a piezoelectric material powder having desired particle diameters. In this case, the average particle diameter of the piezoelectric material powder is preferably 0.1 to 1.0 $\mu$m, more preferably 0.3 to 0.7 $\mu$m. With such a particle diameter, piezoelectric portions having an average particle diameter of 1 to 10 $\mu$m can be obtained by heat treatment as mentioned later.

Incidentally, control of the particle diameters of the powder may also be made by heat-treating the piezoelectric material powder obtained by grinding at 400 to 750° C. In this case, smaller particles adhere to other particles, a powder of uniform particle diameters is obtained, and a piezoelectric portion of uniform grain size can be provided, therefore, such a manner of control is preferred. The piezoelectric material may also be produced, for example, by an alkoxide method or a co-precipitation method.

A piezoelectric material containing a ternary and substitution system composition as a major component can be produced in the same manner as the piezoelectric material containing a ternary and addition system composition as a major component, except that simple substances of elements (Pb, Ba, Ca, Sr, La, Mg, Ni, Nb, Zr and Ti), oxides of these elements (e.g. PbO, $Pb_3O_4$, $La_2O_3$, MgO, NiO, $Nb_2O_5$, $TiO_2$ and $ZrO_2$), carbonates of these elements (e.g. $BaCO_3$, $SrCO_3$, $MgCO_3$ and $CaCO_3$), compounds containing a plurality of such elements (e.g. $MgNb_2O$), etc. are mixed so that the contents of these elements (Pb, Ba, Ca, Sr, La, Mg, Ni, Nb, Zr and Ti) give a formulation of a desired piezoelectric ceramic composition, and then the resulting mixed raw material is calcined at one time.

As the method for forming a layer of the piezoelectric material obtained, there can be mentioned, for example, screen printing, spraying and dipping. Of these, screen printing is preferred because a layer of desired shape and thickness can be formed easily and continuously at a high precision.

In the present invention, then, an electrode is formed on the first piezoelectric material layer formed as described above; a second piezoelectric material layer of higher Ni content than in the first piezoelectric material layer is formed on the electrode. Thereby, the resulting multi-layered piezoelectric device can have dense piezoelectric portions that are substantially free from a heterogeneous phase composed mainly of $ZrO_2$.

The method for forming the electrode and the method for forming the piezoelectric material layer are as mentioned above, and the range of electrode formation is as mentioned previously with respect to the multi-layered piezoelectric device of the present invention. The method for producing the piezoelectric material is also the same as mentioned previously, except that the Ni content in the raw material is made higher than in the raw material for the first piezoelectric material layer.

In the present invention, when the piezoelectric portions are formed in three or more layers, another electrode is formed on the second piezoelectric material layer. Then, on that electrode, a third piezoelectric material layer having an Ni content that is the same as or higher than in the second piezoelectric material layer is formed. This step is conducted a required number of times. Incidentally, the expression "third piezoelectric material" does not exclude that the material is the same as the second piezoelectric material and, when piezoelectric portions are formed in four or more layers, does not exclude that materials of different compositions are used for the third piezoelectric material layer and the fourth and upper piezoelectric material layers.

In the present invention, lastly, the laminate obtained after the required number of piezoelectric material layers have been formed is heat-treated. Thereby, the densification of second and upper piezoelectric portions favorably affect the first piezoelectric portion, and it is possible to obtain a piezoelectric device wherein all the piezoelectric portions are densified. Further, the above heat treatment allows the first piezoelectric portion to solidly attach to the substrate directly or via an electrode. Incidentally, in the present invention, the electrodes connected to the third and upper piezoelectric portions need not be heat-treated when the final laminate has been obtained, and may be heat-treated separately after the formation thereof. From the standpoint of production efficiency, however, the electrodes are preferably heat-treated when the final laminate has been obtained.

In the present invention, since the piezoelectric material layers have different Ni content, the need to use an atmosphere-controlling material is low. However, in order to form piezoelectric portions having the desired Ni contents, it is preferred to conduct heat treatment in the presence of an atmosphere-controlling material having substantially the same Ni content as in the lastly formed piezoelectric material layer.

The atmosphere-controlling material preferably contains NiO in an amount of 0.03 to 0.50 mg, more preferably 0.07 to 0.40 mg, and more preferably 0.10 to 0.30 mg per $cm^3$ of atmosphere.

When the Ni amount, in terms of NiO, is less than 0.03 mg per $cm^3$ of atmosphere, it is difficult to obtain a piezoelectric portion having the desired Ni content. The resulting piezoelectric device therefore tends to be low in linearity of flexural displacement to electric field when exposed to a high electric field. Meanwhile, when the amount of NiO is more than 0.50 mg per $cm^3$ of atmosphere, particles composed mainly of NiO are present in excess and become a starting point for dielectric breakdown, which, therefore, tends to take place.

In order to prevent the vaporization of other components and reliably obtain piezoelectric portions having the desired compositions, the atmosphere-controlling material preferably contains other components in about the same amounts as in the lastly formed piezoelectric material layer.

In the present invention, the heat treatment temperature of the laminate is preferably 1,000 to 1,400° C., more preferably 1,100 to 1,350° C. When the temperature is less than 1,000° C., the solid attachment between substrate or electrode and piezoelectric portion and the density of each piezoelectric portion may be insufficient. When the temperature is more than 1,400° C., the amount of Pb and Ni that vaporizes from the piezoelectric material is large, making it difficult to obtain a piezoelectric portion having the desired composition.

The holding time of the maximum temperature during heat treatment is preferably 10 minutes to 10 hours, more preferably 1 hour to 4 hours.

When the holding time of the maximum temperature is less than 10 minutes, the densification of each piezoelectric portion tends to be insufficient and it may be impossible to obtain the desired characteristics. When the holding time of the maximum temperature is more than 10 hours, the total amount of Pb and Ni that vaporizes is large, even when atmosphere control is provided, and reduced characteristics and increased dielectric breakdown occur.

EXAMPLES

The present invention is specifically described below by way of Examples. However, the present invention is not restricted to these Examples. Incidentally, the multi-layered piezoelectric devices produced in the Examples and Comparative Examples were measured for flexural displacement as follows and evaluated.

Flexural Displacement

A voltage was applied between the upper and lower electrodes so that the generated electric field became 3 kV/mm, and the resulting flexural displacement was measured using a laser displacement tester.

Example 1

A platinum lower electrode [dimensions: 1.2 mm×0.8 mm×3 $\mu$m (thickness)] was formed by screen printing on a $Y_2O_3$-stabilized $ZrO_2$ substrate with a flat thin part [thin part dimensions: 1.6 mm×1.1 mm×10 $\mu$m (thickness)], and heat treatment at 1,300° C. for 2 hours was applied to integrate the electrode with the substrate. ¥

A first piezoelectric material layer composed of $Pb_{1.00}\{(Mg_{0.97}Ni_{0.03})_{1/3}Nb_{2/3}\}_{0.20}Ti_{0.43}Zr_{0.37}O_3$, in dimensions of 1.3 mm×0.9 mm×7 $\mu$m (thickness) was formed thereon by screen-printing, and then a platinum internal electrode [dimensions: 1.0 mm×1.1 mm×3 $\mu$m (thickness)] was formed thereon by screen printing.

A second piezoelectric material layer made of a ceramic composition containing 98.5% by mass of $Pb_{1.00}(Mg_{1/3}Nb_{2/3})_{0.20}Ti_{0.43}Zr_{0.37}O_3$ and 1.5% by mass of NiO, in dimensions of 1.3 mm×0.9 mm×7 $\mu$m (thickness) was then formed thereon by screen printing to form a laminate.

The resulting laminate was subjected to heat treatment at 1,275° C. for 2 hours in a vessel with an atmosphere-controlling material having the same composition as the second piezoelectric material, which was allowed to be present in the vessel in an amount of 0.15 mg (in terms of NiO) per $cm^3$ of atmosphere. The thickness of each of the piezoelectric portions after the heat treatment was 5 $\mu$m.

Lastly, a gold upper electrode [dimensions: 1.2 mm×0.8 mm×0.5 $\mu$m (thickness)] was formed thereon by screen printing, followed by a heat treatment, whereby a piezoelectric device having two piezoelectric portion layers was produced. The compositions of the piezoelectric materials used are shown in Table 1.

Examples 2 and 3 and Comparative Examples 1 and 2

Piezoelectric devices each having two piezoelectric portion layers were produced in the same manner as in Example 1, except that piezoelectric materials having the formulations shown in Table 1 were used.

TABLE 1

| | First piezoelectric material | | Second piezoelectric material | |
|---|---|---|---|---|
| | Formulation | Ni content (%) | Formulation | Ni content (%) |
| Comparative Example 1 | $Pb_{1.00}\{(Mg_{0.97}Ni_{0.03})_{1/3}Nb_{2/3}\}_{0.20}Ti_{0.43}Zr_{0.37}O_3$ | 0.05 | $Pb_{1.00}(Mg_{1/3}Nb_{2/3})_{0.20}Ti_{0.43}Zr_{0.37}O_3 + NiO$ | 1.50 |
| Example 1 | $Pb_{1.00}\{(Mg_{0.95}Ni_{0.05})_{1/3}Nb_{2/3}\}_{0.20}Ti_{0.43}Zr_{0.37}O_3$ | 0.08 | $Pb_{1.00}(Mg_{1/3}Nb_{2/3})_{0.20}Ti_{0.43}Zr_{0.37}O_3 + NiO$ | 1.50 |
| Example 2 | $Pb_{1.00}\{(Mg_{0.87}Ni_{0.33})_{1/3}Nb_{2/3}\}_{0.20}Ti_{0.43}Zr_{0.37}O_3$ | 0.20 | $Pb_{1.00}(Mg_{1/3}Nb_{2/3})_{0.20}Ti_{0.43}Zr_{0.37}O_3 + NiO$ | 1.50 |
| Example 3 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 1.50 |
| Comparative Example 2 | $Pb_{1.00}\{(Mg_{0.67}Ni_{0.33})_{1/3}Nb_{2/3}\}_{0.20}Ti_{0.43}Zr_{0.37}O_3$ | 0.50 | $Pb_{1.00}(Mg_{1/3}Nb_{2/3})_{0.20}Ti_{0.43}Zr_{0.37}O_3 + NiO$ | 1.50 |

Evaluation

As shown in Table 2, the flexural displacements were small, at 2.45 μm and 2.41 μm, respectively, in the piezoelectric device of Comparative Example 1, in which the Ni content in the first piezoelectric portion was small at 0.05% by mass, and in the piezoelectric device of Comparative Example 2, in which the Ni content in the first piezoelectric portion was large at 0.50% by mass.

In contrast, the flexural displacements were large, at 2.69 to 2.75 μm, in all of the piezoelectric devices of Examples 1 to 3, in which the Ni content in the first piezoelectric portion was 0.08 to 0.31% by mass and the Ni content in the second piezoelectric portion was 1.50% by mass. In the piezoelectric devices of Examples 2 and 3, in which the ratio of NiO contents (first/second) were 0.13 and 0.21, respectively, the flexural displacements were particularly large, at 2.72 or more, as shown in Table 2.

Evaluation

As shown in Table 4, the flexural displacements were very small, at 2.33 μm or less, in the piezoelectric devices of Comparative Examples 3 and 4, in which the Ni content in second piezoelectric portion was the same as or smaller than the Ni content in first piezoelectric portion.

In contrast, the flexural displacements were large, at 2.62 μm or more, in all of the piezoelectric devices of Examples 3–6, in which the Ni content in second piezoelectric portion was larger than the Ni content in first piezoelectric portion. In the piezoelectric device of Example 5, in which the ratio of NiO contents (first/second) was 0.10, the flexural displacement was particularly large at 2.70, similar to the piezoelectric device of Example 3, in which the ratio was 0.21, as shown in Table 4.

TABLE 2

| | Ni content in piezoelectric portion (%) | | Ratio of NiO contents (first/second) | Flexural displacement (μm) |
|---|---|---|---|---|
| | First | Second | | |
| Comparative Example 1 | 0.05 | 1.50 | 0.03 | 2.45 |
| Example 1 | 0.08 | 1.50 | 0.05 | 2.69 |
| Example 2 | 0.20 | 1.50 | 0.13 | 2.75 |
| Example 3 | 0.31 | 1.50 | 0.21 | 2.72 |
| Comparative Example 2 | 0.50 | 1.50 | 0.33 | 2.41 |

TABLE 4

| | Ni content in piezoelectric portion (%) | | Ratio of NiO contents (first/second) | Flexural displacement (μm) |
|---|---|---|---|---|
| | First | Second | | |
| Comparative Example 3 | 0.31 | 0.10 | 3.10 | 2.19 |
| Comparative Example 4 | 0.31 | 0.31 | 1.00 | 2.33 |
| Example 4 | 0.31 | 1.00 | 0.31 | 2.65 |
| Example 3 | 0.31 | 1.50 | 0.21 | 2.72 |
| Example 5 | 0.31 | 3.00 | 0.10 | 2.70 |
| Example 6 | 0.31 | 5.00 | 0.06 | 2.62 |

Examples 4 to 6 and Comparative Examples 3 and 4

Piezoelectric devices each having two piezoelectric portion layers were produced in the same manner as described in Example 1, except that piezoelectric materials having the formulations shown in Table 3 were used.

Examples 7 to 10

Piezoelectric devices each having two piezoelectric portion layers were produced in the same manner as in Example 1, except that piezoelectric materials having the formulations shown in Table 5 were used.

TABLE 3

| | First piezoelectric material | | Second piezoelectric material | |
|---|---|---|---|---|
| | Formulation | Ni content (%) | Formulation | Ni content (%) |
| Comparative Example 3 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 0.10 |
| Comparative Example 4 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 0.31 |
| Example 4 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 1.00 |
| Example 3 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 1.50 |
| Example 5 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 3.00 |
| Example 6 | $Pb_{1.00}\{(Mg_{0.80}Ni_{0.20})_{1/3}Nb_{2/3}\}_{0.20}Ti_{0.43}Zr_{0.37}O_3$ | 0.31 | $Pb_{1.00}(Mg_{1/3}Nb_{2/3})_{0.20}Ti_{0.43}Zr_{0.37}O_3 + NiO$ | 5.00 |

TABLE 5

| | First piezoelectric material | | Second piezoelectric material | |
|---|---|---|---|---|
| | Formulation | Ni content (%) | Formulation | Ni content (%) |
| Example 7 | $Pb_{1.00}\{(Mg_{0.95}Ni_{0.05})_{1/3}Nb_{2/3}\}_{0.20}Ti_{0.43}Zr_{0.37}O_3$ | 0.08 | $Pb_{2.00}(Mg_{1/3}Nb_{2/3})_{0.20}Ti_{0.43}Zr_{0.37}O_3$ + NiO | 0.77 |
| Example 8 | $Pb_{1.00}(Mg_{1/3}Nb_{2/3})_{0.20}Ti_{0.43}Zr_{0.37}O_3$ + NiO | 0.08 | $Pb_{2.00}(Mg_{1/3}Nb_{2/3})_{0.20}Ti_{0.43}Zr_{0.37}O_3$ + NiO | 0.77 |
| Example 9 | $Pb_{2.00}(Mg_{1/3}Nb_{2/3})_{0.20}Ti_{0.43}Zr_{0.37}O_3$ + NiO | 0.08 | $Pb_{1.00}\{(Mg_{0.50}Ni_{0.50})_{1/3}Nb_{2/3}Ti_{0.43}Zr_{0.37}O_3$ | 0.77 |
| Example 10 | $Pb_{1.00}\{(Mg_{0.95}Ni_{0.05})_{1/3}Nb_{2/3}\}_{0.20}Ti_{0.43}Zr_{0.37}O_3$ | 0.08 | $Pb_{1.00}\{(Mg_{0.50}Ni_{0.50})_{1/3}Nb_{2/3}Ti_{0.43}Zr_{0.37}O_3$ | 0.77 |

Evaluation

The flexural displacements were large, at 2.64 μm or more, in all of the piezoelectric devices. The flexural displacement was largest at 2.69 μm in the piezoelectric device of Example 7, in which the first piezoelectric portion was formed with a piezoelectric material obtained by substituting part of Mg in ceramic composition with Ni (i.e., the material referred to as a "substitution system piezoelectric material") and the second piezoelectric portion was formed with a piezoelectric material obtained by adding NiO to a ceramic composition (i.e., the material referred to as "addition system piezoelectric material"). In other piezoelectric devices, flexural displacements were large, in the order of ② a piezoelectric device of a first piezoelectric portion made of an addition system piezoelectric material and a second piezoelectric portion made of an addition system piezoelectric material, ③ a piezoelectric device of a first piezoelectric portion made of an addition system piezoelectric material and a second piezoelectric portion made of a substitution system piezoelectric material, and ④ a piezoelectric device of a first piezoelectric portion made of a substitution system piezoelectric material and a second piezoelectric portion made of a substitution system piezoelectric material. The results are shown in Table 6.

TABLE 6

| | Ratio of NiO contents | State of Ni inclusion | | Flexural displacement |
|---|---|---|---|---|
| | (first/second) | First | Second | (μm) |
| Example 7 | 0.10 | Substitution | Addition | 2.69 |
| Example 8 | 0.10 | Addition | Addition | 2.67 |
| Example 9 | 0.10 | Addition | Substitution | 2.66 |
| Example 10 | 0.10 | Substitution | Substitution | 2.64 |

Example 11

A platinum lower electrode was formed on a $ZrO_2$ substrate and they were integrated in the same manner as described in Example 1. A first piezoelectric material layer made of a ceramic composition of $Pb_{1.00}\{(Mg_{0.87}Ni_{0.13})_{1/3}Nb_{2/3}\}_{0.20}Ti_{0.43}Zr_{0.37}O_3$ (NiO content: 0.2% by mass), in dimensions of 1.3 mm×0.9 mm×7 μm (thickness) was formed thereon by screen printing.

A platinum internal electrode [dimensions: 1.0 mm×1.1 mm×3 μm (thickness)] was then formed thereon by screen printing. Next, a second piezoelectric material layer made of a ceramic composition containing 99.5% by mass of $Pb_{1.00}(Mg_{1/3}Nb_{2/3})_{0.20}Ti_{0.43}Zr_{0.37}O_3$ and 0.5% by mass of NiO, in dimensions of 1.3 mm×0.9 mm×7 μm (thickness) was formed thereon by screen printing. Then, a platinum internal electrode [dimensions: 1.0 mm×1.1 mm×3 μm (thickness)] was formed thereon by screen printing, and a third piezoelectric material layer made of a ceramic composition containing 98.5% by mass of $Pb_{1.00}(Mg_{1/3}Nb_{2/3})_{0.20}Ti_{0.43}Zr_{0.37}O_3$ and 1.5% by mass of NiO, in dimensions of 1.3 mm×0.9 mm×7 μm (thickness) was formed thereon by screen printing.

The resulting laminate was subjected to heat treatment at 1,275° C. for 2 hours in a vessel with an atmosphere-controlling material having the same composition as the uppermost piezoelectric material layer, which was allowed to be present in the vessel in an amount of 0.15 mg (in terms of NiO) per $cm^3$ of atmosphere. The thicknesses of each of the piezoelectric portions after the heat treatment was 5 μm.

Lastly, a gold upper electrode [dimensions: 1.2 mm×0.8 mm×0.5 μm (thickness)] was formed thereon by screen printing, followed by a heat treatment, whereby a multi-layered piezoelectric device having three piezoelectric portion layers was produced.

Example 12

A multi-layered piezoelectric device having three-piezoelectric portion layers was produced in the same manner as in Example 11, except that a second piezoelectric material layer made of a ceramic composition containing 98.5% by mass of $Pb_{1.00}(Mg1_{/3}Nb_{2/3})_{0.20}Ti_{0.43}Zr_{0.37}O_3$ and 1.5% by mass of NiO was formed by screen printing on an internal electrode.

Evaluation

The flexural displacement of the piezoelectric device of Example 12, in which Ni contents were the same in the second piezoelectric portion and the third piezoelectric portion, and the ratio of the NiO content in first piezoelectric portion and second piezoelectric portion was small at 0.13, was larger than in the piezoelectric device of Example 11, in which the Ni content was smaller in the second piezoelectric portion than in the third piezoelectric portion and the ratio of the NiO content in the first piezoelectric portion and the second piezoelectric portion was large at 0.40. Incidentally, when the Ni content in third piezoelectric portion is smaller than that in second piezoelectric portion, the densification in third piezoelectric portion is small. It is therefore presumed that the densification in the adjacent second piezoelectric portion, etc. tends to be suppressed and the flexural displacement of the resulting piezoelectric device is smaller than that of Example 12. The formulations of the piezoelectric materials used and the results of evaluation are shown in Table 7.

TABLE 7

|  | Ni content (%) | | Ratio of NiO contents (first/second) | Flexural displacement ($\mu$m) |
|---|---|---|---|---|
|  | Second piezoelectric material | Third Piezoelectric material | | |
| Example 11 | 0.5 | 1.5 | 0.40 | 2.61 |
| Example 12 | 1.5 | 1.5 | 0.13 | 2.68 |

As described above, the present invention provides a multi-layered piezoelectric device which has a very high piezoelectric characteristic, is superior in transmitting of oscillation between the ceramic substrate and the piezoelectric portions, and is suitably used in actuators, sensors, etc., and a process for producing such a piezoelectric device.

What is claimed is:

1. A multi-layered piezoelectric device comprising:
   a ceramic substrate;
   a plurality of piezoelectric portions formed in layers on said ceramic substrate, including a first piezoelectric portion made of a piezoelectric ceramic composition containing Ni in terms of NiO in an amount of 0.08 to 0.31% by mass and a second and subsequent piezoelectric portions each made of a piezoelectric ceramic composition having a higher Ni content than that of said first piezoelectric portion; and
   a plurality of electrodes, electrically connected to said piezoelectric portions, formed in layers on said ceramic substrate such that an electrode layer is at least provided between said first piezoelectric portion and said second piezoelectric portion on said ceramic substrate.

2. The multi-layered piezoelectric device according to claim 1, wherein a mass ratio (first/second) in terms of NiO of the Ni content of said first piezoelectric portion to that of said second piezoelectric portion is in a range of 0.1 to 0.2.

3. The multi-layered piezoelectric device according to claim 1, wherein a third and subsequent piezoelectric portions are made of a piezoelectric ceramic composition having an Ni content that is the same or larger than that in said second piezoelectric portion.

4. The multi-layered piezoelectric device according to claim 1, wherein said first piezoelectric portion is solidly attached to said substrate directly or via one of said electrodes.

5. The multi-layered piezoelectric device according to claim 1, wherein said first piezoelectric portion is made of a piezoelectric ceramic composition containing a major component of a Pb(Mg,Ni)$_{1/3}$Nb$_{2/3}$O$_3$—PbZrO$_3$—PbTiO$_3$ ternary solid solution system composition that is represented by the following general formula (1);

$$pb_x\{(Mg_{1-y}Ni_y)_{1/3x a}Nb_{2/3}\}_b Ti_c Zr_d O_3 \quad (1);$$

wherein x is 0.95≦x≦1.05; y is 0.05≦y≦0.50; a is 0.90≦a≦1.10; b, c and d are decimal fractions, in coordinates formed by three coordinate axes of b, c and d, in a range of (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), and wherein b+c+d=1.000; and wherein said second and subsequent piezoelectric portions are made of a piezoelectric composition containing a major component of a PbMg$_{1/3}$Nb$_{2/3}$O$_3$—PbZrO$_3$—PbTiO$_3$ ternary solid solution system composition that is represented by the following general formula (2) and further containing NiO;

$$Pb_x(Mg_{y/3}Nb_{2/3})_a Ti_b Zr_c O_3 \quad (2);$$

wherein x is 0.95≦x≦1.05; y is 0.95≦y≦1.05; a, b and c are decimal fractions, in coordinates formed by three coordinate axes of a, b and c, in a range of (a,b,c)=(0.550, 0.425, 0.025), (0.550, 0.325, 0.125), (0.375, 0.325, 0.300), (0.100, 0.475, 0.425) and (0.375, 0.425, 0.200), and a+b+c=1.00.

6. The multi-layered piezoelectric device according to claim 5, wherein a mass ratio (first/second) in terms of NiO of the Ni content of said first piezoelectric portion to that of said second piezoelectric portions is in a range of 0.1 to 0.2.

7. The multi-layered piezoelectric device according to claim 5, wherein third and subsequent piezoelectric portions are made of a piezoelectric ceramic composition having an Ni content that is the same or larger than that in said second piezoelectric portion.

* * * * *

UNITED STATES PATENT AND TRADEMARK OFFICE
CERTIFICATE OF CORRECTION

PATENT NO. : 6,888,292 B2
DATED : May 3, 2005
INVENTOR(S) : Toshikatsu Kashiwaya and Mutsumi Kitagawa It is certified that error appears in the above-identified patent and that said Letters Patent is hereby corrected as shown below:

Title page,
Item [56], References Cited, FOREIGN PATENT DOCUMENTS,
please change "EP   1 321 986 A2 6/1993" to -- EP   1 321 986 A2 6/2003 --

Column 3,
Line 17, please add -- The -- before "present invention"

Column 18,
Line 32, please add -- (0.100, 0.425, 0.475), -- after "0.325, 0.300),"
Line 37, please replace "portions" with -- portion --

Signed and Sealed this

Twelfth Day of July, 2005

JON W. DUDAS
*Director of the United States Patent and Trademark Office*